United States Patent
Lawrence

(10) Patent No.: US 8,581,115 B2
(45) Date of Patent: Nov. 12, 2013

(54) GROUNDING BAR/HATCHPLATE FOR USE WITH LIGHTNING ARRESTORS

(75) Inventor: Jonathan G. Lawrence, Sandy Hook, CT (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 787 days.

(21) Appl. No.: 12/569,599

(22) Filed: Sep. 29, 2009

(65) Prior Publication Data
US 2011/0042136 A1 Feb. 24, 2011

Related U.S. Application Data

(60) Provisional application No. 61/235,925, filed on Aug. 21, 2009.

(51) Int. Cl.
*H02B 1/00* (2006.01)
*H05K 13/00* (2006.01)

(52) U.S. Cl.
USPC ........... 174/480; 174/503; 174/5 SG; 174/51; 248/200; 248/201; 29/745

(58) Field of Classification Search
USPC ....... 174/480, 481, 5 R, 5 SG, 6, 503, 66, 67, 174/51, 520, 78, 40 CC, 135, 50; 439/188, 439/535, 536, 108, 386, 497; 248/545, 530, 248/200, 201; 29/745
See application file for complete search history.

(56) References Cited

U.S. PATENT DOCUMENTS

| | | | |
|---|---|---|---|
| 4,380,038 A | 4/1983 | Roudeau | |
| 4,456,326 A | 6/1984 | Sauber | |
| 4,733,325 A | 3/1988 | Loesch | |
| 5,221,215 A | 6/1993 | Tan et al. | |
| 5,774,317 A | 6/1998 | Allina | |
| 5,777,263 A * | 7/1998 | Maehler et al. | 174/51 |
| 6,079,995 A * | 6/2000 | Duhe, Jr. | 439/188 |
| 6,252,166 B1 * | 6/2001 | Leschinger | 174/51 |
| 6,313,403 B1 * | 11/2001 | Livingston et al. | 174/51 |
| 6,431,885 B1 | 8/2002 | Stroup | |
| 6,674,000 B2 * | 1/2004 | Lambiaso | 174/50 |
| 6,785,110 B2 | 8/2004 | Bartel et al. | |
| 7,287,990 B1 | 10/2007 | Collier et al. | |
| 2008/0180917 A1 | 7/2008 | Lawrence | |

OTHER PUBLICATIONS

BURNDY® Products "Two Hole HYLUP™ Flex Conductor Standard Barrel," Compression Connections, Catalog, www.burndy.com, available prior to Aug. 21, 2009, 1 page.
"Round Series 4000 Standoff Insulator Type 4R," http://ep.yimg.com/ca/l/yhst-18711434844524_2069_4847778, available prior to Aug. 21, 2009, 1 page.
"Standoff Electrical Insulators Equivilent to Glastic Electric Stand Offs," Storm Copper Components, Co., http://store.electrical-insulators-and-copper-ground-bars.com/r4200-a5.html, available prior to Aug. 21, 2009, 2 pages.

* cited by examiner

*Primary Examiner* — Angel R Estrada
(74) *Attorney, Agent, or Firm* — Abel Law Group, LLP

(57) ABSTRACT

A hatchplate, formed of copper material, has first and second perpendicular surfaces with punched holes formed therein to provide for connecting the hatchplate to building ground, for mounting the hatchplate to a wall of the telecommunications facility and for mounting one or more surge suppressors to the hatchplate, thereby providing for a suitable ground connection for the surge suppressors.

21 Claims, 4 Drawing Sheets

GROUNDING BAR/HATCHPLATE FOR USE WITH LIGHTNING ARRESTORS

RELATED APPLICATIONS

This application claims benefit to provisional application 61/235,925, filed Aug. 21, 2009, which application is incorporated herein by reference.

BACKGROUND

1. Field of the Invention

This application relates to mounting mechanisms for surge suppressors used for an antenna system in telecommunication facilities.

2. Description of the Related Art

For cellular equipment towers, antenna cables which are exposed to lightning need to be properly grounded and bonded to the building grounding system to prevent damage to equipment, property and injury to personnel from the lightning.

For antenna cables, a standard approach provides exterior conductor grounding (outer sheath) to the roof ground ring or tower ground system prior to the cables turn toward the building entrance. About 10 percent of the voltage carried by the outer sheath or conductor can be induced on the center conductor, even though the center conductor is insulated from the outer sheath. That induced voltage is not clamped to ground via the rooftop cable grounding kit (which is only designed to protect the outer conductor), and can enter the building and equipment unimpeded and create dangerous arcing to other ground sources with different potentials. A surge suppressor is designed to shunt the foreign voltage on the center conductor to a ground source that is referenced to the building's ground system as soon as is practicable upon entering the building. Numerous models of surge suppressors, such as from Polyphaser™ Corporation, provide voltage protection to equipment property and personnel from foreign voltage, which can be induced on the center conductor of the coaxial cable during a lightning strike.

Traditional equipment locations in some communications facilities may provide a higher level of electrical and grounding protection than typically encountered at other building equipment locations such as Collocation Hotels, and privately owned high-rise buildings where communication companies may lease rooftop and building spaces.

Prior approaches for mounting or installing such surge suppressors for antenna cabling have used common electrical cabinets for all users of the facilities of insufficient gauge or ground reference. Such installation typically utilizes ad hoc field drilling or Greenlee Punching, which subjects all previous installations to risk when adding additional surge suppressors. The traditional electrical cabinets are painted, 12 gauge steel and do not provide the surface area, conductive material or minimum material thickness required to provide a reliable grounded surge suppressor mounting surface. In addition, the traditional electrical cabinets are often only bonded to the building ground system using a #6AWG conductor. In locations where multiple cellular providers share a tower, one company's surge suppression equipment may interfere with another company's equipment and installation of additional surge suppressors may in fact pose a risk to service during the installation due to damage to cabling. Improper or inconsistent grounding of each antenna cable and surge suppressor may create differences in potential at the cabinet, which could result in arcing and current flow to those cables with less resistance or fewer ohms to ground. Thus, current approaches to installation of surge suppressors for antenna cabling at cellular towers are inadequate for a number of reasons.

SUMMARY

Accordingly, in one embodiment, a hatchplate is provided for mounting at least one surge suppressor that includes a first surface having a first mounting hole formed therein for mounting the hatchplate to a wall or other structure in a telecommunications facility. The hatchplate has a second surface perpendicular to the first surface that has at least one ground conductor mounting hole formed therein for coupling a ground conductor to the hatchplate and a surge suppressor mounting hole for coupling a surge suppressor to the hatchplate. In an embodiment, the first surface further has a plurality of additional surge suppressor mounting holes and at least one other mounting hole. The second surface may further include two sets of ground conductor mounting holes, each set for attaching a two-hole compression lug. The first and second surfaces of the hatchplate are formed of hard drawn copper plate material with punched holes to form the first mounting hole, the ground conductor mounting hole and the surge suppressor mounting hole.

In another embodiment, a method of using a hatchplate in a telecommunications facility is provided. The hatchplate has a first and second surface perpendicular to each other. The method includes attaching the hatchplate to a structure in the telecommunications facility using a first mounting hole formed in the first surface, an isolator, and a mounting bolt. The method further includes coupling a ground conductor to the hatchplate using a two-hole compression lug attached to the hatchplate at two ground connector holes formed in the hatchplate, inserting a portion of a surge suppressor in a surge suppressor mounting hole in the hatchplate, and securing the surge suppressor thereto, thereby coupling the surge suppressor through the ground conductor to facility ground.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
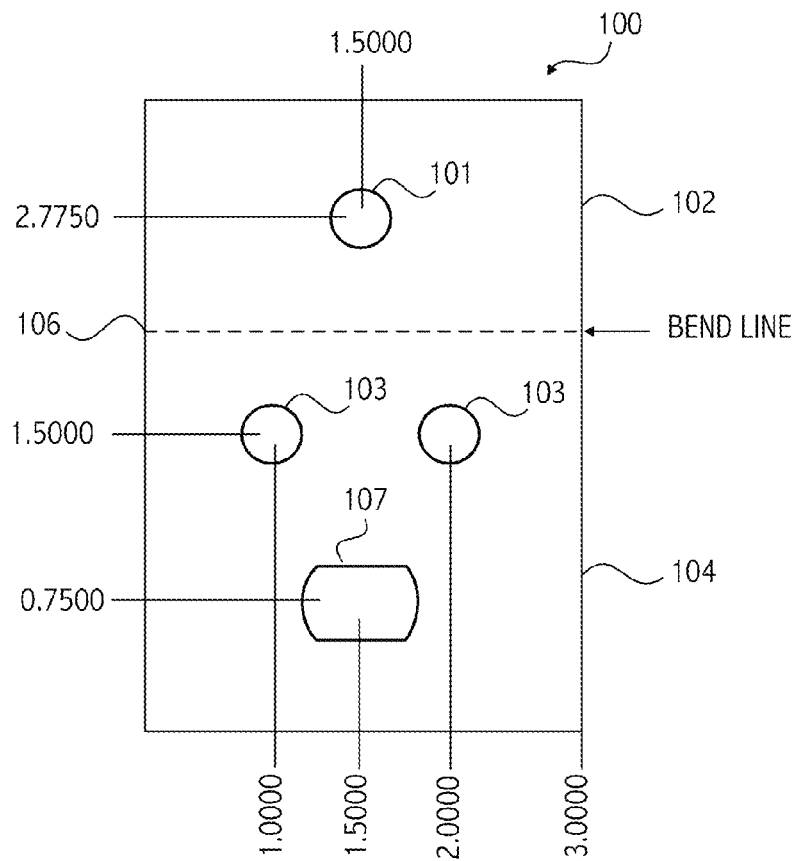
FIG. 1 illustrates a first view of a hatchplate according to one embodiment of the invention.
Figure 2:
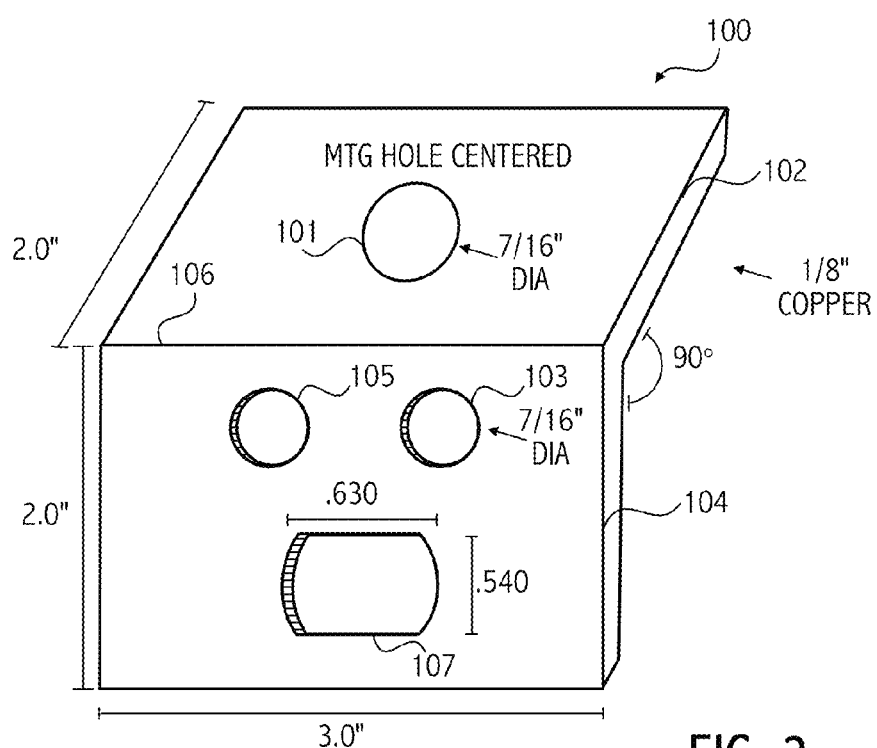
FIG. 2 provides a second view of the embodiment shown in FIG. 1.

FIG. 1 illustrates a bulkhead/hatchplate 100 according to an embodiment of the invention that provides for a single antenna/single surge suppressor use. FIG. 2 shows another view of the bulkhead/hatchplate 100. In an embodiment, the bulkhead/hatchplate 100 is formed of ⅛ inch thick hard drawn copper bus plate, which provides a minimum material thickness for a reliable grounded surge suppressor mounting surface. The single position hatchplate 100 has a single mounting hole 101 for the isolator (apple) or insulator, a two hole lug punching 103 for the ground conductor and a single double "D" punching 107 sized for the surge suppressor being used. Of course, the shape and size of the punching 107 is dictated by the particular surge suppressor being used. Mounting hole 101 formed in the copper bus plate allows the hatchplate to be mounted in a wall mount configuration to a structure (such as a wall) of a telecommunications facility. The two holes 103 formed in the copper bus plate provide a way to attach the bulkhead/hatchplate 100 to the ground system of the building in which the bulkhead/hatchplate is mounted, using, e.g., a #2 AWG two hole compression lug and attendant stranded copper cabling. The hatchplate's first and second surfaces, 102 and 104, are joined at a right angle bend. Exemplary spacing and sizing of the various mounting holes are shown in FIGS. 1 and 2. Where multiple single position hatchplates, such as those shown in FIGS. 1 and 2 are used in a telecommunications facility, because each bulkhead/hatchplate 100 has its own separate ground conductors run to the same zero reference ground location through the compression lugs and copper cabling, the surge suppressor installations are less susceptible to any differences in ground potential and resultant arcing. The single position hatchplate embodiment 100 shown in FIGS. 1 and 2 can be mounted in various orientations to accommodate field conditions.

Figure 3:
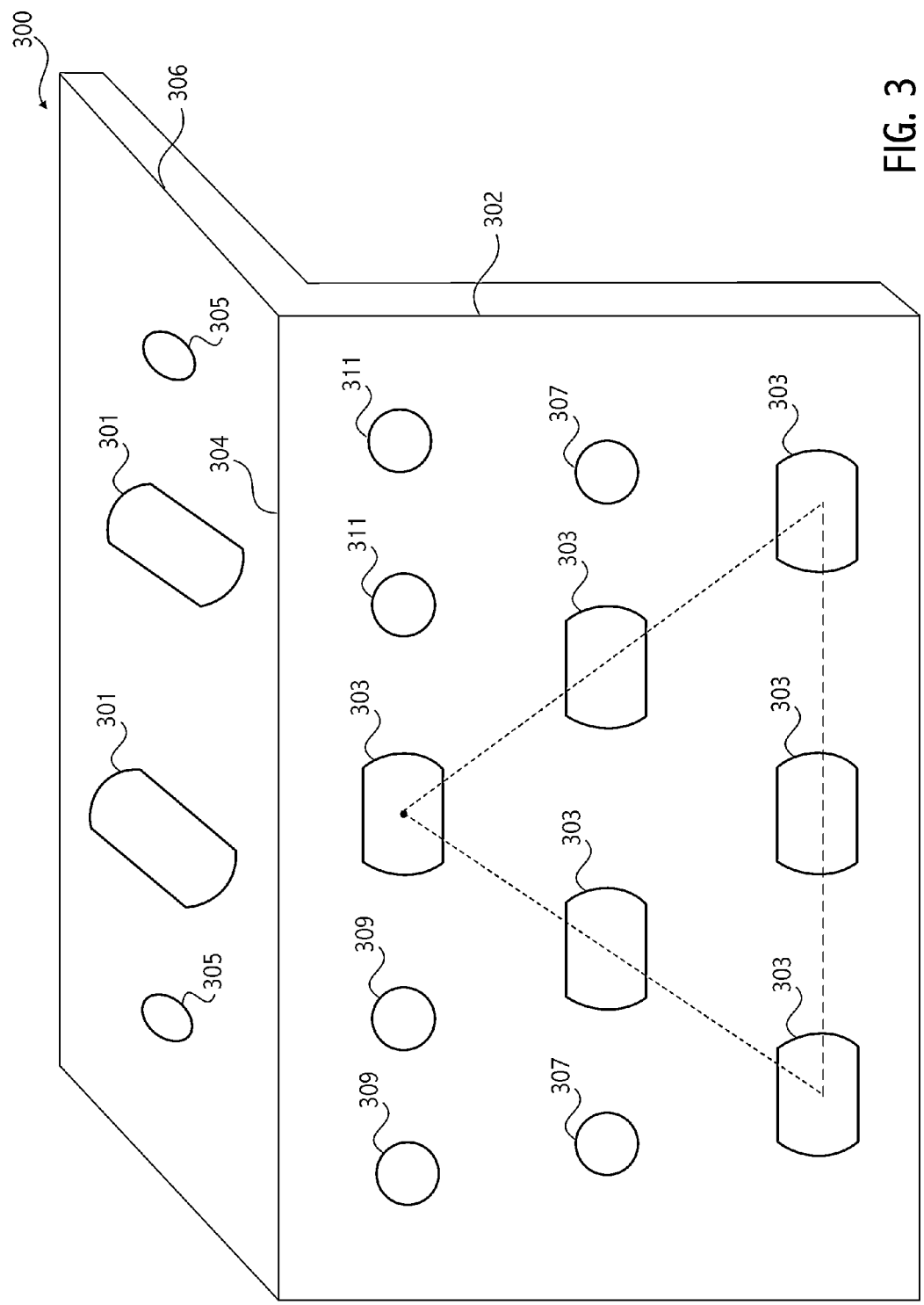
FIG. 3 illustrates a first view of a hatchplate according to another embodiment of the invention.
Figure 4:
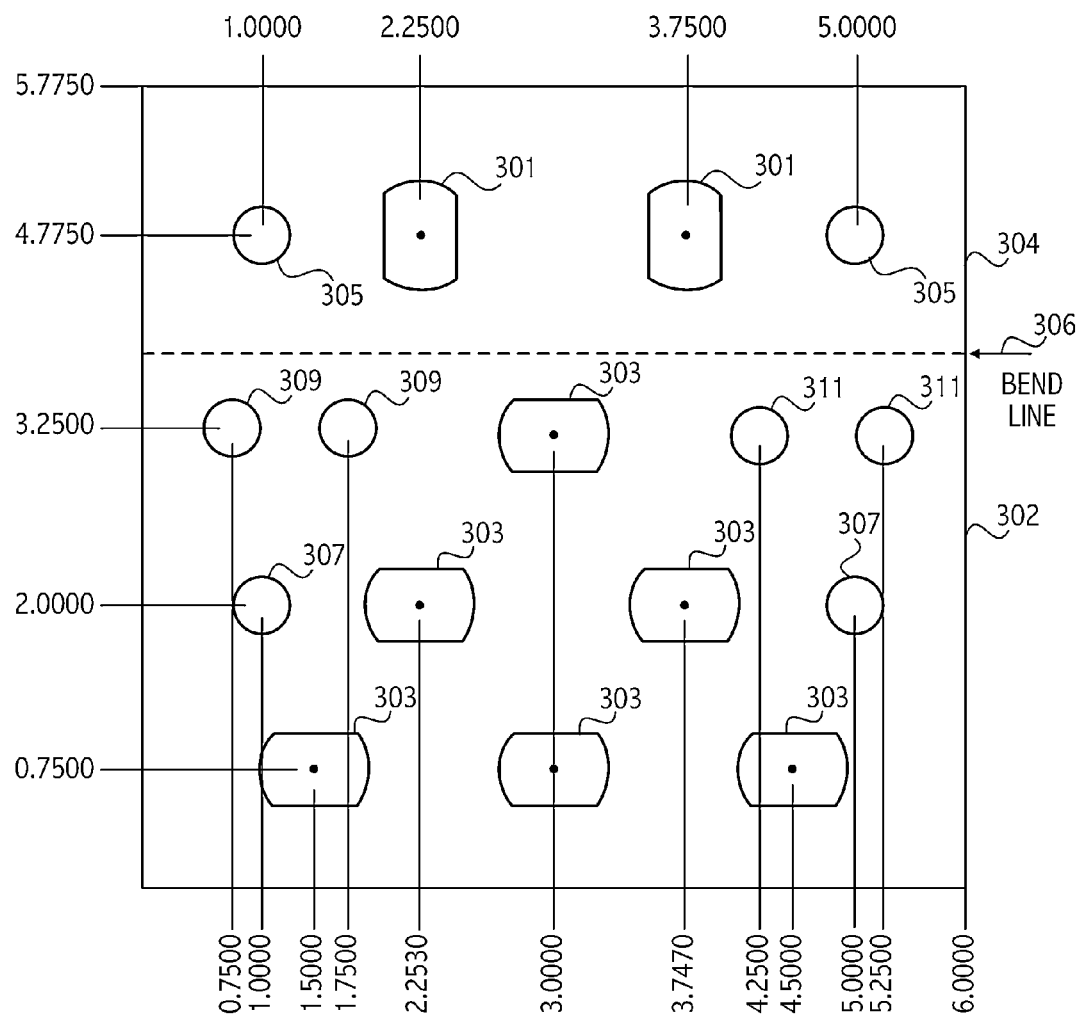
FIG. 4 provides a second view of the embodiment shown in FIG. 3.

In another embodiment, various views of which are shown in FIGS. 3 and 4, bulkhead/hatchplate 300 is configurable and can be used for either a one or two surge suppressor or for up to six antenna/surge suppressors depending upon mounting orientation and location specifics. In an embodiment, the bulkhead/hatchplate 300 provides a standard approach to mounting from 1 to 6 surge suppressors on an insulated/isolated copper plate, which can be mounted within a small cabinet, or in a wall mount configuration which can then be bonded to the building's ground system by, e.g., two #2 AWG two hole compression lugs and attendant stranded copper cabling. By eliminating the cabinet method, each cellular carrier can isolate its surge suppressors from one another, thereby improving their overall lightning protection and service reliability. The use of the configurable bulkhead/hatchplate 300 (or the smaller single bulkhead/hatchplate 100) allows the carriers to start fresh at each cell site using a more robust grounding procedure without affecting existing in-service equipment that uses an alternative method until existing in-service equipment (antennas and surge suppressors) can be migrated over to the new hatchplate.

The embodiment shown in FIGS. 3 and 4 provides a hatchplate 300 constructed of ⅛ inch thick hard drawn copper plate material with punched holes adequately spaced to allow for ease of installation and maintenance of one to six surge suppressors and user serviceable replacement gas tube carbons. Exemplary spacings are shown in FIG. 4. The hatchplate 300 has a first surface 302, a right angle bend 304, and a second surface (or flange) 306 perpendicular to the first surface 302. The flange 306 includes two punched holes 301 for mounting up to two surge suppressors. The surface 302 includes six punched holes 303 for use with up to six surge suppressors. The punched holes 301 and 303 are in the form of a double "D" in the embodiment shown for use with a Polyphaser™ surge suppressor product. Other shapes of punched holes, other than the double "D" may of course be appropriate depending upon the type of surge suppressor used. The hatchplate embodiment 300 can be wall mounted either horizontally or vertically (when viewed from the floor) through mounting holes 305 or 307 using two isolators and hardware (anchor bolts). The hatchplate 300 can be wall mounted like a bookshelf through mounting holes 305 thereby providing a maximum of six surge suppressor punchings for use. All surge suppressors are direction sensitive (antenna side and equipment side) and the antennas should avoid sharp bends prior to entering the surge suppressor. The bar may be mounted in the orientation which affords the straightest cable path from the antenna to the surge suppressors.

The bar can also be mounted flush to the wall through mounting holes 307, with the surface 302 parallel to the wall with up to two double "D" punchings 301 on the flange (surface 304) side if needed. The isolators provide several inches of separation between the wall and the hatchplate no matter whether mounted through mounting holes 301 or 307. In both orientations, either of two sets of holes 309 and 311 can be used with two hole compression lugs and grounding cables to bond/ground the plate to the building's ground system.

The ⅛th inch copper bar is better suited than painted steel to provide a grounding platform for the surge suppressors. Each carrier can ground their equipment independent of each other and eliminate the congestion at the joint grounding cabinet. Poor grounding at the cabinet places other conductors at risk, whereas a hatchplate according to the embodiments described herein provides a zero or near zero ohm connection for each surge suppressor to building ground. A hatchplate according to the embodiments described herein provides secure mounting surface for from one to six antenna cables which can be used to roll or migrate from the cabinet installations to a more robust grounding system. Lightning surges that affect property, service and personnel can be reduced or eliminated using various embodiments of the hatchplate described herein. In contrast, the old cabinet method provided only a limited number of in-line "prime locations" for the suppressors, did not provide adequate grounding, material composition, or thickness and was usually jointly used by all carriers, which may have increased the risk of in-service failures due to cable congestion.

Note that the surge suppressor punchouts shown in FIGS. 3-4 are spaced/positioned sufficiently apart to afford maintenance access to the field serviceable lightning suppressors, should suppressors or components thereof need to be replaced, without disconnecting adjacent antenna cable connections in the multiple cable configurations.

Figure 5:
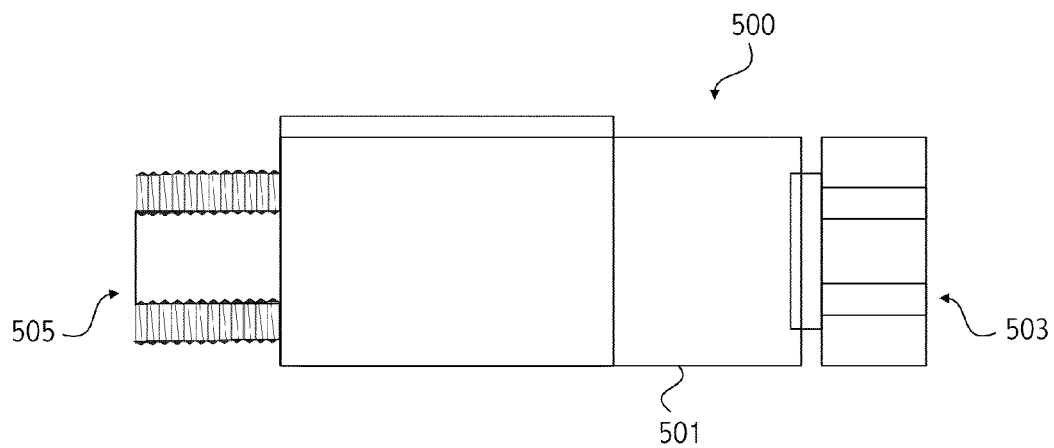
FIG. 5 illustrates an exemplary surge suppressor that may be utilized in the embodiments of FIGS. 1-4.
Figure 6:
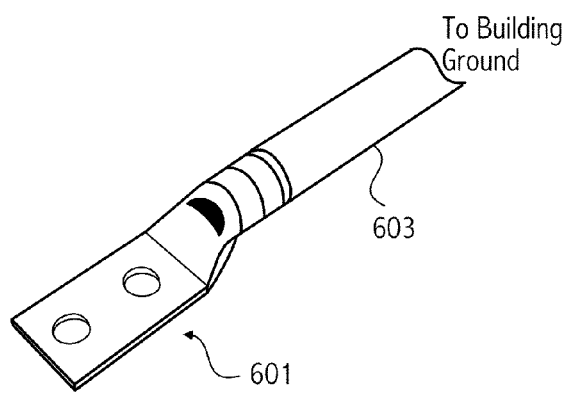
FIG. 6 illustrates an exemplary two hole compression lug that may be utilized with the embodiments of FIGS. 1-4.
Figure 7:
FIG. 7 illustrates an exemplary isolator that may be utilized with the embodiments illustrated in FIGS. 1-4.

Referring to FIG. 5, illustrated is an exemplary surge suppressor that may be utilized with the present invention. The surge suppressor 501 is coupled to the antenna cable and to cable coupled to equipment at ends 503 and 505. Operation of the surge suppressors is known in the art. The threaded end 505 of surge suppressor 503 may be inserted in holes 107, 301, or 303 and secured to the hatchplate. FIG. 6 illustrates an exemplary two hole compression lug 601 along with an exemplary copper grounding cable 603 for attachment to building ground. FIG. 7 illustrates an exemplary isolator for use in mounting the various embodiments of the hatchplates shown herein to the building wall. The isolator may be used in combination with an inch worm shaped bracket to provide clearance between the wall surface and the hatchplate of about two inches from use of the bracket and another two inches from use of the isolator to provide a total clearance of approximately four inches.

Thus, various embodiments have been described for a hatchplate for mounting one or more surge suppressors. Note that the description of the invention set forth herein is illustrative, and is not intended to limit the scope of the invention as set forth in the following claims. For example, a different number of punched holes other than those illustrated may be utilized according to hatchplate size and system needs. Variations and modifications of the embodiments disclosed herein may be made based on the description set forth herein without departing from the scope of the invention as set forth in the following claims.

What is claimed is:

1. An apparatus comprising:
    a hatchplate having a first surface with a first mounting hole formed therein for mounting the hatchplate to a structure;
    an isolator inserted in the first mounting hole providing separation between the hatchplate and the structure when mounted;
    a second surface perpendicular to the first surface having at least one ground conductor mounting hole formed therein for coupling a ground conductor to the hatchplate and having a surge suppressor mounting hole; and
    a surge suppressor secured to the hatchplate through the surge suppressor mounting hole.

2. The apparatus as recited in claim 1 wherein the first mounting hole is centered in the first surface.

3. The apparatus as recited in claim 1 wherein the first surface further has a plurality of additional surge suppressor mounting holes and at least one other mounting hole.

4. The apparatus as recited in claim 3 wherein the second surface further comprises two sets of ground conductor mounting holes, including the ground conductor mounting hole forming one portion of one of the two sets, each set for attaching a two hole compression lug.

5. The apparatus as recited in claim 4 wherein the second surface further includes an additional plurality of surge suppressor mounting holes formed therein.

6. The apparatus as recited in claim 5 wherein the surge suppressor mounting hole and the additional plurality of surge suppressor mounting holes form a triangular pattern on the second surface.

7. The apparatus as recited in claim 5 wherein the second surface further comprises first and second mounting holes for mounting the hatchplate to the structure.

8. The apparatus as recited in claim 7 wherein the mounting holes on the second surface are outside of two surge suppressor mounting holes.

9. The apparatus as recited in claim 5 wherein the hatchplate can be mounted to the structure through the first surface or the second surface and either the first surface or the second surface is perpendicular to the wall.

10. The apparatus as recited in claim 5 wherein the ground conductor mounting holes are in pairs disposed on either side of the surge suppressor hole on top of the triangle.

11. The apparatus as recited in claim 5 wherein, with multiple surge suppressors mounted to the hatchplate, the surge suppressor mounting holes are positioned sufficiently apart to provide maintenance access to field serviceable lightning suppressors without disconnecting adjacent antenna cable connections.

12. The apparatus as recited in claim 1 wherein the first surface and the second surface are formed of hard drawn copper plate material with punched holes to form the first mounting hole, the ground conductor mounting hole and the surge suppressor mounting hole.

13. The apparatus as recited in claim 1 wherein one to two surge suppressors can be mounted in a first orientation of the hatchplate and one to six surge suppressors can be mounted in a second orientation of the hatchplate.

14. The apparatus as recited in claim 1 wherein the hatchplate is at least one eighth inch thick.

15. A method of using a hatchplate in a telecommunications facility, the hatchplate having a first and second surface perpendicular to each other, the method comprising:
    attaching the hatchplate to a structure in the telecommunications facility using a first mounting hole formed in the first surface, an isolator, and a mounting bolt;
    coupling a ground conductor to the hatchplate using a two hole compression lug attached to the hatchplate at two ground connector holes formed in the hatchplate and to a ground of the structure; and
    inserting a portion of a surge suppressor in a surge suppressor mounting hole in the hatchplate and securing the surge suppressor thereto.

16. The method as recited in claim 15 coupling a ground conductor to the hatchplate at the second surface using a two-hole compression lug connected to a grounding cable.

17. The method as recited in claim 15 wherein the two ground connector holes and the at least one surge suppressor mounting hole are formed in the second surface.

18. The method as recited in claim 15 further comprising mounting the hatchplate to the structure using two mounting holes formed in the first surface so that the second surface is parallel to a floor of the telecommunications facility.

19. The method as recited in claim 18 further comprising inserting a plurality of surge suppressors into a respective plurality of surge suppressor mounting holes formed in the second surface.

20. The method as recited in claim 15 wherein the two ground connector holes are formed in the first surface and the surge suppressor mounting hole is formed in the second surface.

21. The method as recited in claim 15 wherein the two ground connector holes are formed in the second surface and a single surge suppressor mounting hole is formed in the second surface.

* * * * *